(12) United States Patent
Jacobson

(10) Patent No.: US 7,572,342 B2
(45) Date of Patent: Aug. 11, 2009

(54) METHOD AND APPARATUS FOR CLEANING SEMICONDUCTOR PHOTOLITHOGRAPHY TOOLS

(75) Inventor: Guy Jacobson, Fairview, OR (US)

(73) Assignee: Wafertech, LLC, Camas, WA (US)

(*) Notice: Subject to any disclaimer, the term of this patent is extended or adjusted under 35 U.S.C. 154(b) by 312 days.

(21) Appl. No.: 11/445,892

(22) Filed: Jun. 2, 2006

(65) Prior Publication Data

US 2007/0277851 A1 Dec. 6, 2007

(51) Int. Cl.
*B08B 1/00* (2006.01)

(52) U.S. Cl. .............................. 134/6; 134/21; 134/25.4; 134/32; 134/33; 134/42; 134/902; 438/906

(58) Field of Classification Search ...................... 134/6, 134/21, 25.4, 32, 33, 42, 902; 438/906
See application file for complete search history.

(56) References Cited

U.S. PATENT DOCUMENTS

| | | | | |
|---|---|---|---|---|
| 5,963,315 | A * | 10/1999 | Hiatt et al. ............... | 356/237.3 |
| 7,045,019 | B1 * | 5/2006 | Hemker et al. ............ | 134/18 |
| 2004/0084059 | A1 * | 5/2004 | Xia et al. .................. | 134/1.3 |
| 2007/0277851 | A1 * | 12/2007 | Jacobson .................. | 134/6 |

* cited by examiner

*Primary Examiner*—Sharidan Carrillo
(74) *Attorney, Agent, or Firm*—Duane Morris LLP

(57) ABSTRACT

A system for cleaning semiconductor lithography tools provides for cycling a polished-side down semiconductor wafer through the lithography tool using conventional automated robotics for loading and unloading the wafer from a vacuum chuck of the lithography tool. The vacuum chuck may provide a continuous clamping vacuum feature and may include a vacuum ring that surround the periphery of the vacuum chuck. The chuck and vacuum ring may advantageously be formed of a high accuracy ceramic or plastic such as ZeroDur ceramic. The polished side of the semiconductor wafer includes grooves in a polished surface and which extend inwardly from a peripheral edge of the wafer, the grooves provide gaps between the wafer and chuck allowing the wafer to be released by a slow loss of vacuum-pressure through the gaps. The pristine clean polished surface of the wafer getters contaminating particles from the chuck.

13 Claims, 2 Drawing Sheets

METHOD AND APPARATUS FOR CLEANING SEMICONDUCTOR PHOTOLITHOGRAPHY TOOLS

FIELD OF THE INVENTION

The present invention relates, most generally, to the semiconductor manufacturing industry, and more particularly to a method for cleaning photolithography tools.

BACKGROUND

In today's semiconductor manufacturing industry, particles are defects that can destroy a semiconductor device by either affecting features at the level at which the particle occurs, or other features in other levels of the semiconductor device. Various lithography tools are used to form patterns in the various device layers of the semiconductor device. Particles in such lithography tools cause a defective pattern to be formed. Contaminating particles may include skin, bacteria, dust, silicon particles, metallic particles, and the like. The particles may emanate from the surface of the semiconductor wafer itself, or they may be generated by the manufacturing equipment used to process the wafers.

Semiconductor photolithography tools such as scanners and steppers include highly precisioned vacuum chucks to transport wafers throughout the system and to secure the wafer in the desired position when a pattern is being formed on the wafer. It is critical that the wafer surface includes a uniform height with respect to the exposure system, especially as technology progresses to producing nanometer-sized features in the patterns being projected onto the wafer surface in the photolithography tool. As such, the vacuum chucks used in the semiconductor manufacturing industry are manufactured to miniscule uniformity tolerances so that there is virtually no deformation of the wafer and the wafer surface being exposed is at a highly uniform level. Particle contamination that occurs on the exposure chucks of such lithography tools causes the wafer surface to deform, thereby deviating from the projected image plane and creating defocus spots or "hot spots" in the pattern formed on the wafer. These defocus spots distort the pattern formed on the wafer which can destroy device functionality. It is therefore imperative to maintain a pristine vacuum chuck in such lithography systems.

One way to remove particle contamination from a chuck is to mechanically open the lithography tool and physically wipe down and clean the chuck. This is obviously undesirable as it will expose sensitive components to conditions external to the highly controlled environment of the tool, and also possibly induce hardware related issues. Such disturbances carry the potential for extended downtime due to troubleshooting/repair of hardware, metrology setups, re-qualification and re-testing that must be carried out prior to releasing the system for manufacturing use. Moreover, by opening the system, further particle contamination may be introduced and various mechanical settings may be disrupted. It would therefore be desirable to clean the tool using a vehicle that is automatically and quickly cycled throughout the tool, precluding the need to open the tool. Upside-down (USD) wafers with highly-polished surfaces are known to attract particles that may be contained on a chuck, for example. A shortcoming of this approach is that many advanced photolithography tools include continuous vacuum clamping of the wafer to the chuck to avoid repositioning or other distortion of the wafer and pattern. Because the chucks and/or the vacuum rings that contact the polished semiconductor wafer surface are formed of highly-precisioned material such as ZeroDur® ceramics or other ceramics and plastics, the confronting surfaces are so smooth that a virtually perfect vacuum seal is formed between the wafer and the chuck or vacuum ring. Therefore, the technique of using USD wafers on continuously vacuum clamping chucks, is precluded because the vacuum seal prevents the release of the wafer from the vacuum chuck using the automated robotics used to transfer the wafer, i.e. to load and unload the wafer onto the chuck.

It would therefore be desirable to provide a method for cleaning a technologically advanced photolithography tool without having to open the system and by using USD wafers that can be cycled through the lithography tool using the automated robotics conventionally associated with such tools.

SUMMARY OF THE INVENTION

To address these and other needs, and in view of its purposes, the present invention provides a method for cleaning a semiconductor lithography tool. The method includes cycling a wafer disposed polished-side down on a chuck through the lithography tool. The polished side of the wafer includes a polished surface. Grooves are formed in the polished surface and extend to the peripheral edge of the wafer.

In another aspect, the present invention provides a device for cleaning a semiconductor lithography tool comprising a vacuum chuck disposed within the semiconductor lithography tool and a wafer disposed polished-side down on the vacuum chuck. The polished side comprises a polished surface with grooves therein, the grooves extending inwardly from a peripheral wafer edge.

BRIEF DESCRIPTION OF THE DRAWING

The present invention is best understood from the following detailed description when read in conjunction with the accompanying drawing. It is emphasized that, according to common practice, the various features of the drawings are not necessarily to scale. On the contrary, the dimensions of the various features may be arbitrarily expanded or reduced for clarity. Like numerals denote like features throughout the specification and drawing. Included in the drawing are the following figures.

DETAILED DESCRIPTION

Figure 1:
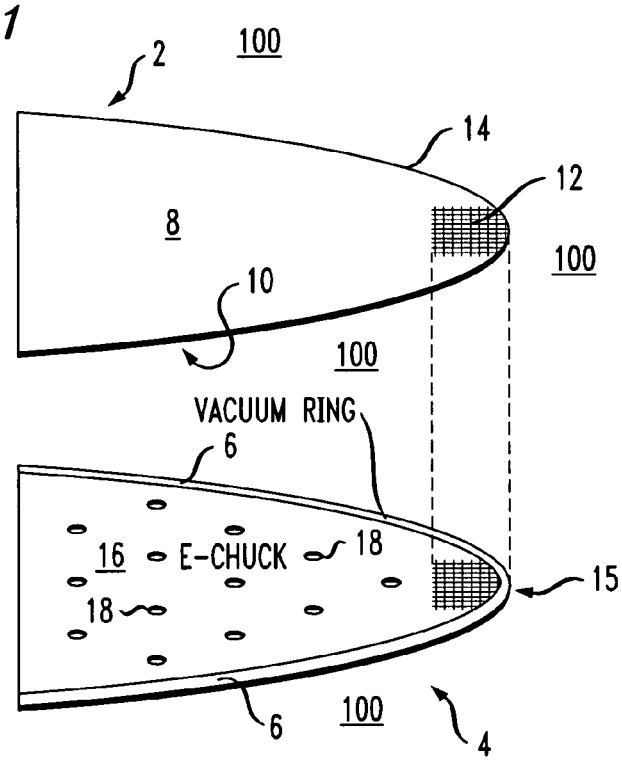
FIG. 1 is a perspective partial view showing an underside of an upside-down wafer aligned over a chuck.

The invention provides a method and device for cleaning semiconductor lithography tools. Polished-side down semiconductor wafers are cycled through the lithography tool using conventional automated robotics for loading, unloading and transporting the wafer within the lithography tool. The wafers are received on a vacuum chuck that may provide a continuous clamping vacuum feature and may include a vacuum seal ring that surrounds the periphery of the vacuum chuck. The vacuum chuck and/or vacuum seal ring may advantageously be formed of a high precision ceramic or plastic and the polished side of the semiconductor wafer includes a polished surface and grooves formed in the polished surface. The grooves extend inwardly from a peripheral edge of the wafer and provide gaps between the wafer and vacuum chuck (or vacuum seal ring), breaking vacuum and allowing the wafer to be released by a slow loss of vacuum-pressure through the gaps. The pristine clean polished surface of the wafer attracts and scavenges contaminating particles from the chuck.

The invention is applicable to various semiconductor lithography tools such as projection printers, steppers and scanners. One exemplary lithography tool in which the invention finds application are 5500 series scanners built by ASML of Veldhoven, Holland, but other ASML tools and lithography tools provided by other manufacturers are among other lithography tools within which the invention may be utilized. The various photolithography tools may use various features for forming an image, i.e., a pattern, on the surface of a semiconductor wafer. The primary chuck in the lithography tool that holds a wafer substrate in place for the scanning or stepping operation is typically a vacuum chuck that may also be referred to as an exposure chuck or e-chuck. The exposure chuck accepts a loaded wafer, transports the wafer internally throughout the lithography tool, holds it in place during the scanning or stepping operation, further transports the wafer and allows the wafer to be unloaded from the chuck.

Semiconductor wafers have opposed sides—a polished side and a ground side. The polished side is highly polished and is the side upon which semiconductor devices are formed. As such, when cycling through the lithography tool for patterning, the pattern is formed on the highly polished side and the opposed ground side of the wafer is in contact with, i.e., rests on, the vacuum chuck. Because the ground side is not as smooth as the front side, a near-perfect vacuum seal is not formed between the wafer and the vacuum chuck, enabling the front-side-up wafer to be loaded onto and removed from the vacuum chuck using the automated robotics of the lithography tool.

The invention provides a cleaning technique in which upside-down (USD) wafers are loaded onto a vacuum chuck, polished-side down, and cycled throughout a lithography tool. The polished side of the wafer has grooves extending to the peripheral edge of the wafer preventing a perfect vacuum seal from forming between the USD wafer and the vacuum chuck or vacuum ring, as would otherwise be the case absent the grooves.

FIG. 1 is a partial and exploded view showing USD wafer 2 disposed over vacuum chuck 4 within interior 100 of a lithography tool. Underside 8 of USD wafer 2 includes pattern 12 of grooves that extend to peripheral edge 14 of wafer 2. Wafer 2 may be formed of silicon, gallium arsenide, InP, or various other substrate materials that are used in the semiconductor manufacturing industry. USD wafer 2 also includes top side 10. Pattern 12 of grooves will be shown in more detail at subsequent figures. Vacuum chuck 4 may include a vacuum seal ring, or vacuum ring 6 that peripherally surrounds vacuum chuck 4 or in other exemplary embodiments, vacuum ring 6 may not be used. Vacuum chuck 4 includes receiving surface 16 that is desirably kept clean of particles so that no deformation occurs when wafers, in particular, production wafers come in contact with vacuum chuck 4. Vacuum ring 6 may be slightly raised with respect to surface 16 such that, when USD wafer 2 is loaded onto vacuum chuck 4 using the automated robotics of the lithography tool, underside 8 of USD wafer 2 contacts vacuum ring 6 but not surface 16 of vacuum chuck 4. Other arrangements may be used in other exemplary embodiments.

Underside 8 of USD wafer 2 is the polished side of the wafer according to the invention which provides a cleaning method whereby particles from vacuum chuck 4 are electrostatically or otherwise attracted to the highly polished surface of underside 8 of USD wafer 2. Commercially available wafers polished to high smoothness and uniformity tolerances, are available. When underside 8 of USD wafer 2 is disposed on or in close proximity to vacuum chuck 4 and vacuum ring 6, particles which may be on vacuum chuck 4 are attracted to underside 8 which effectively getters particles from the vacuum chuck 4, thereby cleaning vacuum chuck 4. USD wafer 2 may be loaded onto vacuum chuck 4 using a conventional automated robotics provided in the semiconductor tool.

Vacuum chuck 4 and vacuum ring 6 are formed of highly accurately polished surfaces with virtually no defects and extremely uniform surfaces. Vacuum chuck 4 and/or vacuum ring 6 may be formed of various plastic, glass and ceramic materials. The materials used for vacuum chuck 4 and vacuum ring 6 are materials that demonstrate extremely low thermal expansion with outstanding 3D homogeneity and which are polished to a very high accuracy. In one exemplary embodiment, ZeroDur®, a glass ceramic with an extremely low thermal expansion coefficient manufactured by Schott North America of Duryea, Pa. 18642, may be used. In one exemplary embodiment, the flatness uniformity may be formed to meet a tolerance of plus/minus 10-25 nanometers and the flatness uniformity of the upper surface of vacuum ring 6 may be formed to satisfy a tolerance of plus/minus 10-25 nanometers. The surface smoothness and uniformity of confronting surfaces underside 8 of USD wafer 2 and vacuum ring 6, according to the embodiment in which vacuum ring 6 makes continuous contact with the periphery of USD wafer 2, provides a near-perfect vacuum seal formed between the polished underside 8 of USD wafer 2, and vacuum chuck 4. Vacuum may be delivered through ports 18 or other arrangements on vacuum chuck 4. In conventional arrangements that do not utilize the grooves of the invention, the near-perfect vacuum seal prevents USD wafer 2 from being removed from vacuum chuck 4 using conventional system robotics, when a vacuum is supplied to vacuum chuck 4, such as in various lithography tools that utilize continuous vacuum clamping to assure that product wafers are maintained in substantially perfectly aligned positions and do not move with respect to vacuum chuck 4. The present invention addresses and corrects this problem.

Figure 2:
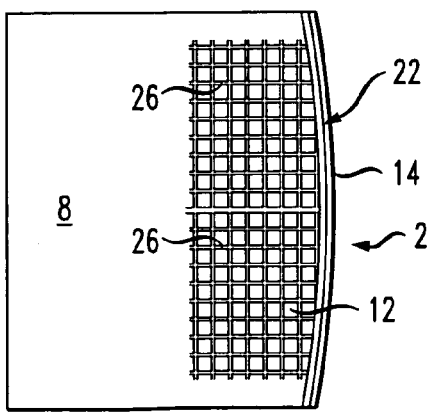
FIG. 2 superimposes the location of a vacuum seal ring with respect to an exemplary groove pattern formed on a wafer.

Contact area 15 illustrates the superimposition of pattern 12 of grooves formed on underside 8 of USD wafer 2, over the portion of vacuum chuck 4 and vacuum ring 6 that pattern 12 will be disposed when USD wafer 2 is disposed on vacuum chuck 4 and vacuum ring 6. Similarly, FIG. 2 shows a cut-away portion of underside 8 of USD wafer 2 including pattern 12 of grooves and shows location 22 superimposed on underside 8 and pattern 12. Location 22 represents the superimposition of the location of vacuum ring 6 with respect to USD wafer 2 when USD wafer 2 is loaded onto vacuum chuck 4 using automated robotics. Grooves 26 extend to peripheral edge 14 of USD wafer 2 and extend beneath location 22 where the vacuum ring 6 contacts USD wafer 2.

Figure 3:
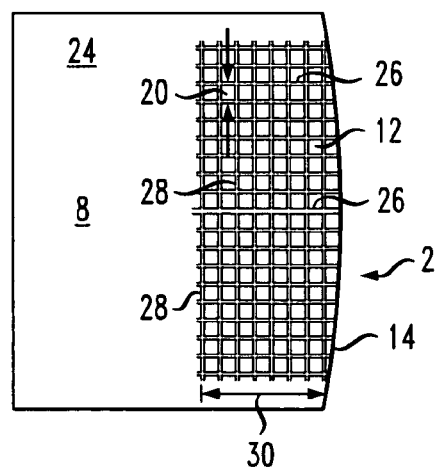
FIG. 3 shows an exemplary pattern of grooves formed along the peripheral edge of a wafer as also shown in FIG. 2.

FIG. 3. shows pattern 12 of grooves 26 formed on underside 8 of USD wafer 2. Grooves 26 are formed in polished surface 24 using conventional patterning and etching methods although other methods may be used. The grid-like pattern 12 of grooves 26 shown in FIGS. 2 and 3 are intended to be exemplary only. Pattern 12 may occupy an area ranging from 1-5 cm² but other areas may be used in other exemplary embodiments. Various other arrangements may be used in other exemplary embodiments. For example, perpendicular grooves 28, shown in FIG. 3, may not be needed in other exemplary embodiments. In the arrangement shown in FIG. 3, grooves 26 are substantially parallel to one another but may not be parallel in other exemplary embodiments. FIG. 3 illustrates grooves 26 extending inwardly by distance 30. Distance 30 is chosen to exceed the width of vacuum chuck 6 that contacts USD wafer 2 but distance 30 may far exceed this distance and grooves 26 may extend further towards or even across the center of USD wafer 2. Grooves 26 may be spaced apart by various distances 20. In one exemplary embodiment, distance 20 may be 80 microns but other distances such as 50-250 microns may be used in other exemplary embodiments. The depth of grooves 26 may be in the range of 1500 plus/minus 200 angstroms, but other suitable depths may be used in other exemplary embodiments. Grooves 26 may include various widths such as 10, 20, 45 or 100 microns but other suitable widths are used in other exemplary embodiments. Grooves 26 create cavities between USD wafer 2 and the vacuum chuck 4/vacuum ring 6 assembly when USD wafer 2 is loaded on vacuum chuck 4 as grooves 26 extend across the intersection at which polished surface 24 and vacuum ring 6 form an otherwise conterminous relationship.

Figure 4:
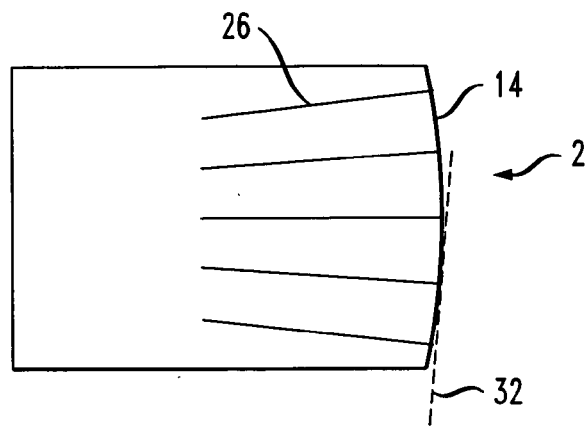
FIG. 4 is an expanded, partial plan view showing exemplary grooves extending to a wafer's periphery.

FIG. 4 shows another exemplary arrangement of pattern 12 of grooves 26 that extend to peripheral edge 14 of USD wafer 2. In this embodiment, there are no transverse grooves such as perpendicular grooves 28 shown in FIGS. 2 and 3 and each of grooves 26 is substantially orthogonal to peripheral edge 14, in particular orthogonal to tangent 32 of peripheral edge 14. Other arrangements of grooves that extend to the peripheral edge of the wafer and form cavities between the wafer and vacuum ring at locations where the wafer contacts the vacuum ring, may be used in other exemplary embodiments.

Figure 5:
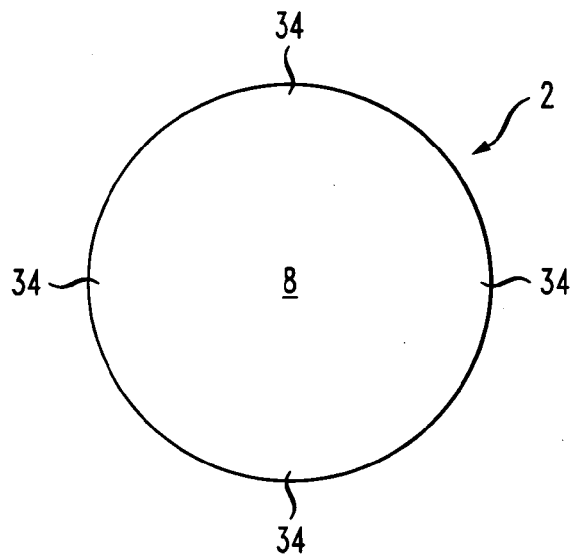
FIGS. 5 and 6 are plan views of an underside of an upside-down semiconductor wafer, each showing an exemplary pattern of grooves extending to the peripheral edge of the wafer.
Figure 6:
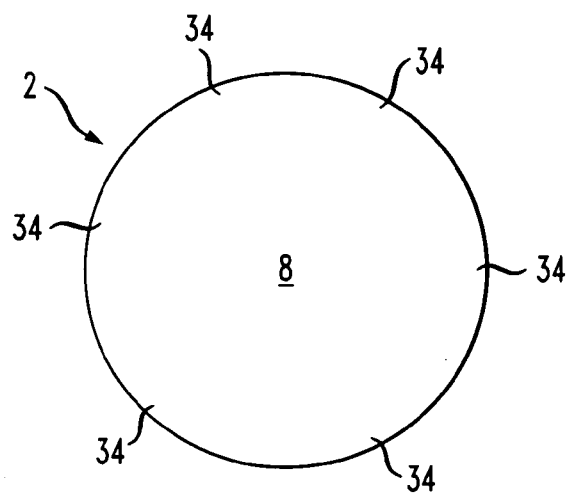

FIGS. 5 and 6 are plan views showing complete underside 8 of USD wafer 2 and each of FIGS. 5 and 6 show the multiple locations 34 at which a group or pattern of grooves, such as the previously shown patterns 12 of grooves 26, can be located. The same pattern or a different pattern of grooves may be used at the various locations 34 on USD wafer 2. FIGS. 5 and 6 are exemplary only and in other exemplary embodiments, there may be fewer or more locations 34 disposed variously around the periphery of USD wafer 2.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and. equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for cleaning a chuck of a semiconductor lithography tool comprising:

cleaning by cycling a wafer through said semiconductor lithography tool, said wafer disposed polished sidedown on said chuck of said semiconductor lithography tool and said polished side comprises a polished surface with grooves therein, said grooves extending inwardly from a peripheral wafer edge of said wafer, wherein said cleaning includes contacting said polished surface with said grooves to said chuck, said polished surface attracting particles from said chuck.

2. The method as in claim 1, wherein said wafer is secured to said chuck by a continuous vacuum applied to said chuck.

3. The method as in claim 1, wherein said chuck includes a vacuum ring extending around a periphery thereof, said wafer contacts said vacuum ring when disposed on said chuck and said grooves extend across a boundary between said vacuum ring and said polished surface.

4. The method as in claim 1, wherein said grooves comprise a plurality of groups of a multiplicity of said grooves disposed around said peripheral wafer edge and, within each of said groups, said grooves of said multiplicity of said grooves are substantially parallel to one another.

5. The method as in claim 1. wherein said cleaning comprises said polished side of said wafer gettering particles from said chuck.

6. The method as in claim 1, wherein said semiconductor lithography tool comprises a scanner.

7. The method as in claim 1, wherein said semiconductor lithography tool comprises a stepper.

8. The method as in claim 1, wherein said chuck is formed of a glass ceramic.

9. The method as in claim 1, wherein said grooves are substantially orthogonal to said peripheral wafer edge.

10. The method as in claim 1. wherein said cycling comprises automatic robotics of said semiconductor lithography tool loading said wafer onto said chuck and unloading said wafer from said chuck.

11. The method as in claim 1, wherein said polished surface and said vacuum ring form a perfect vacuum seal at surface areas not including said grooves.

12. The method as in claim 1, wherein said cycling comprises at least loading said wafer onto said chuck and unloading said wafer from said chuck.

13. The method as in claim 3, wherein said grooves provide cavities between said wafer and said vacuum ring.

* * * * *